United States Patent [19]

Barrow et al.

[11] Patent Number: 4,742,331
[45] Date of Patent: May 3, 1988

[54] DIGITAL-TO-TIME CONVERTER

[75] Inventors: Jeffrey G. Barrow, Oak Ridge, N.C.; Adrian P. Brokaw, Burlington, Mass.

[73] Assignee: Analog Devices, Inc., Norwood, Mass.

[21] Appl. No.: 945,654

[22] Filed: Dec. 23, 1986

[51] Int. Cl.$^4$ .............................................. H03M 1/00
[52] U.S. Cl. .............................. 340/347 R; 328/129.1; 307/234
[58] Field of Search .................... 340/347 R, 347 DA; 328/129.1; 307/234

[56] References Cited

U.S. PATENT DOCUMENTS 2,736,889  2/1956  Kaiser .............................. 340/347 R Primary Examiner—Charles D. Miller
Attorney, Agent, or Firm—Wolf, Greenfield & Sacks

[57] ABSTRACT

A monolithic integrated circuit generates a programmable time delay under control of a digital word. The delay is generated by comparing a ramp signal to a threshold determined by the value of the digital word and appears as a time difference between a trigger pulse and a pulse generated when the value of the ramp voltage equals the value of the threshold voltage. The ramp voltage is generated by a simple resistance/capacitance charging circuit whose time constant can be adjusted by the user. The threshold voltage is set by a digital-to-analog converter (DAC) and resistor circuit which converts the digital control word into a variable voltage. In order to stabilize the device against changes in temperature and power supply variations, a voltage coupling circuit forces the threshold voltage to track changes in the ramp voltage caused by temperature and power supply variations. The coupling circuit obviates the need for precision voltage sources or current mirrors conventionally used to compensate for temperature and power supply changes. Without the need for the latter devices, the integrated circuit can be easily and inexpensively fabricated of transistors of a single bipolar type.

21 Claims, 9 Drawing Sheets

DIGITAL-TO-TIME CONVERTER

FIELD OF THE INVENTION

This invention relates to circuitry for generating programmable time delays.

BACKGROUND OF THE INVENTION

In modern computer control systems, it is frequently necessary to convert a digital signal (which is used internally in the computer) to a variety of analog signals which are used to directly control or measure the environment. Two conversion devices which are often used in manufacturing systems are digital-to-analog converters (DACs) and analog-to-digital converters (ADCs). These units convert between analog signals generated by the environment and the digital signals used by the computer.

Another, perhaps less widely used, conversion device is a digital-to-time converter. This unit accepts a digital signal and produces a proportional time delay. The delay usually appears as a time difference between two pulses appearing at the output of the device or between a trigger pulse and a pulse appearing at the output of the device. Such programmable time delay circuits are often used in automated test equipment and are used to delay digital signals.

Digital-to-time converters have conventionally been fabricated from discrete semiconductor devices. In such devices, the conversion is often performed by comparing a linearly-increasing voltage or current ramp signal to a threshold voltage or current. In one conventional form of a digital-to-time converter, a fixed threshold voltage is set by a precision voltage reference source and the time delay is generated by comparing the threshold voltage to a ramp with a variable slope. The slope of the ramp is set by the value of the digital word to program the device. In another conventional form of the converter, a ramp with a fixed slope is generated and the time delay is obtained by comparing the ramp voltage to a variable threshold whose level is set in accordance with input digital word.

In either of the above variations, when the value of the ramp voltage equals the value of the threshold voltage a pulse signal is generated. If a pulse signal is generated at the start the ramp signal, the time elapsing between the two pulse signals represents a delay which depends on the value of the digital input word. The starting pulse may also be the trigger pulse which is used to start the ramp signal generation.

It would be convenient to fabricate a digital-to-time converter circuit as a monolithic integrated circuit. Such a device would have many obvious advantages over a discrete-device implementation of the same circuit. For example, the integrated circuit would be smaller, have higher reliability, better performance, a lower power consumption and a lower cost. However, practical problems are associated with the implementation of a digital-to-time device as a monolithic integrated circuit. One of these problems arises from the need to produce a device that is stable with variations in temperature and power supply voltages—a problem common with integrated circuits. The solution to temperature and power supply variation compensation problems generally involves the use of precision reference sources.

The first problem is to obtain a predictable ramp signal. In a digital-to-time converter designed with discrete devices, the internal ramp signal is conventionally generated by charging a capacitor with a stable current generated by placing a precision voltage reference source across a precision resistor. Such a precision voltage source is generally comprised of a voltage reference source, a resistor, and a control amplifier connected in a standard feedback configuration. Once a stable charging current has been established, the voltage across the capacitor provides a stable ramp output.

The second problem is to obtain a stable threshold value. In many prior art circuits, the threshold voltage is generated by a digital-to-analog converter (DAC). In order to assure predictable operation, the DAC voltage must also be referenced and controlled so that variations in the voltage caused by temperature and power supply changes track the temperature and supply-induced changes in the ramp voltage. In a typical prior-art design, the same voltage reference source used to generate the ramp signal is used to drive an additional control amplifier or a current mirror circuit to measure and reflect the ramp current into the DAC so that variations in the threshold voltage track variations in the ramp voltage.

This conventional approach requires the fabrication on the integrated circuit of a voltage reference source and control amplifier or a current mirror (which requires two different bipolar transistor types). In either case, the circuit becomes expensive and more difficult to manufacture.

The problem is additionally complicated because typically the resistor and capacitor used to generate the ramp voltage are external to the integrated circuit so that the user can easily change the ramp slope and, thus, the time constants involved in the circuit. However, the threshold voltage is generally determined by internal integrated circuit component values which may not track the temperature and supply changes in the external ramp components.

Accordingly, it is an object of the present invention to provide a digital-to-time converter which can be easily fabricated as a monolithic integrated circuit.

It is another object of the present invention to provide a digital-to-time converter which does not require the use of an internal voltage reference source and control amplifiers.

It is still another object of the present invention to provide a digital-to-time converter which can be manufactured entirely with transistors of one bipolar type.

It is yet another object of the present invention to provide a digital-to-time converter which is temperature and supply variation compensated to produce a stable output in spite of temperature and power supply variations.

It is still another object of the present invention to provide a digital-to-time converter which can be inexpensively manufactured.

SUMMARY OF THE INVENTION

The foregoing problems are solved and the foregoing objects are achieved in one illustrative embodiment of the invention in which a digital-to-time converter is comprised of a ramp generator circuit and a DAC circuit. The input to the ramp generator circuit and the input to the DAC circuit are connected to a voltage coupling circuit which ensures that the changes in the ramp voltage caused by temperature and power supply variations track changes in the threshold voltage produced by the DAC. Thus, variations in the outputs caused by thermal and power supply changes appear as a common mode signal in both the ramp and threshold voltages. The voltages are compared by a differential comparator which rejects the common mode signal and amplifies the differences to generate the output pulse. The need for precision voltage reference sources, control amplifiers and current mirrors is thereby eliminated.

More particularly, the ramp signal is generated by charging a capacitor with a current controlled by a precision resistor. Both of these components are external to the integrated circuit so that the ramp voltage slope can be easily adjusted.

The DAC operates as a plurality of switched parallel-connected, binary-weighted current sources. The sources can be connected either to the DAC output or shunted to the power supply, based on the digital input word. The current running through the DAC output can be passed through a resistor and used to generate a threshold voltage whose value depends on the value of the digital word. However, the total current running through the DAC is independent of the value of the digital word and is, instead dependent on a circuit network which extends through a reference resistor. The voltage appearing across the reference resistor is representative of the thermally-induced changes and power supply variations in the DAC current, and, consequently, the corresponding thermal and power supply-induced changes in the threshold voltage which is generated from the DAC current.

The voltage appearing across the resistor used to generate the ramp voltage is caused to track the voltage appearing across the reference resistor by the voltage coupling circuit. Since the capacitor charging current is determined by the voltage appearing across the ramp resistor, any changes in the DAC current due to temperature and power supply variations will cause a corresponding change in the charging current. Consequently, the thermal and supply-induced changes appear as a common mode signal to the differential output comparator and are rejected. Thus, temperature and supply effects on the operation of the circuit are minimized.

In addition, the circuit values used to set the current in the DAC are chosen so that the DAC current is proportional to absolute temperature (PTAT). With this choice of values internal biasing of the DAC is greatly simplified, eliminating the usual requirements of a control amplifier.

Another feature of the circuit concerns the input circuitry. This circuitry has been designed to reduce reset time, thereby allowing the digital-to-time circuitry to operate at a higher speed.

DETAILED DESCRIPTION OF THE PREFERRED EMBODIMENT

The inventive digital-to-time converter has a TRIGGER input, a RESET input, a minimum delay output and a programmed delay output. The TRIGGER input accepts a positive-going-edge signal to trigger the circuit. Internal circuitry prevents an erroneous re-triggering until the circuit function has been completed. After the circuit has been triggered, and after a propagation delay, a pulse appears at the minimum delay output. This pulse is used in the same fashion as analog ground in a digital-to-analog converter to reference the zero state (zero time delay in the present circuit). Subsequently, after a programmed time delay depending on the values of the digital input word (on leads B1-B8), a second pulse appears at the programmed delay output. The time elapsing between the two pulses represents the time delay generated by the device. The RESET input is dominant over the TRIGGER input. In the presence of a RESET input the device cannot be triggered and, if already triggered, it resets.

Figure 1:
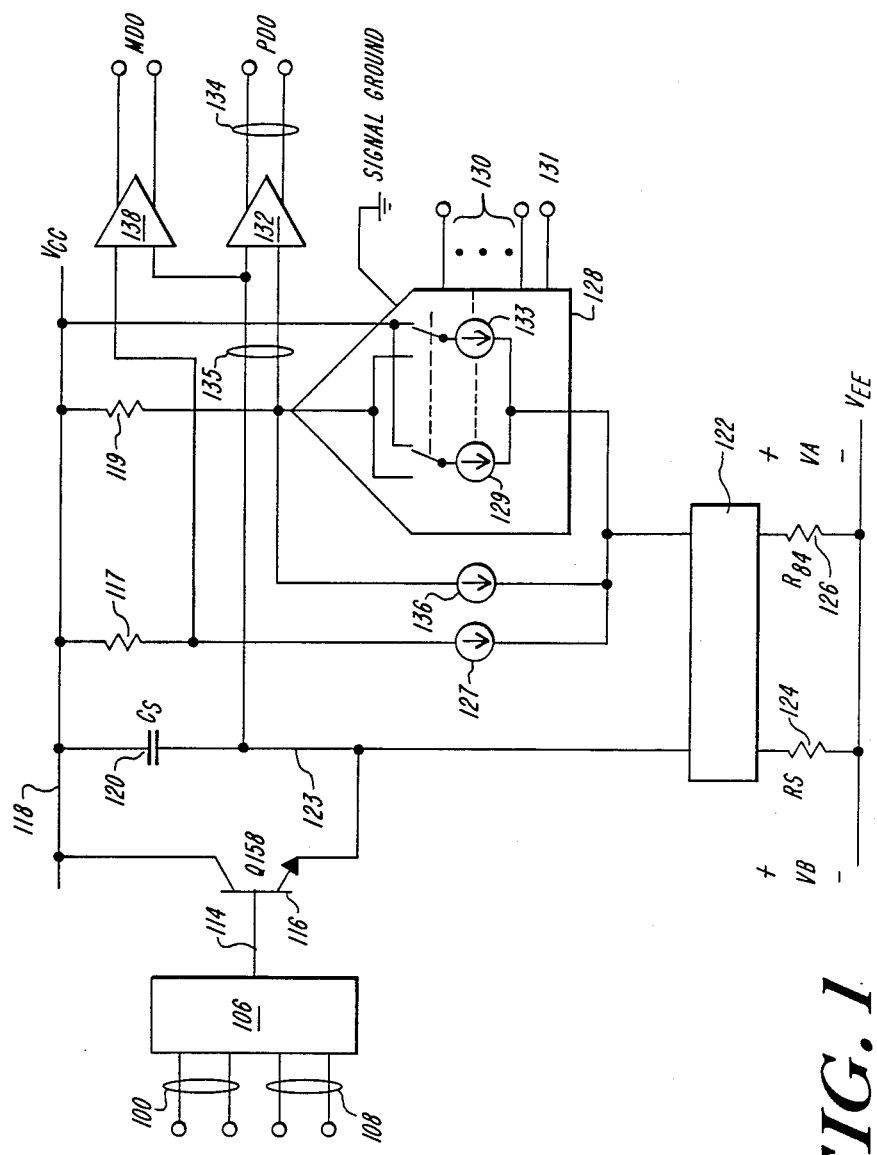
FIG. 1 is a block schematic diagram of the inventive digital-to-time converter circuit.

More particularly, as shown in FIG. 1, the device accepts a differential, or single-ended, emitter-coupled-logic (ECL) signal applied to its TRIGGER input 100. The TRIGGER signal on lead 100 is applied to input and ramp start circuitry 106. Upon a rising edge being detected, the ramp start circuitry controls the charging of capacitor 120 which, as will hereinafter be described, generates the ramp voltage used to generate the programmed time interval.

Circuitry 106 also responds to signals on the RESET leads 108, but contrary to the operation of the TRIGGER portion of the circuit, circuit 106 is designed to be sensitive to the level of the RESET signal rather than the signal edges. When a "high" RESET signal is applied to the RESET leads 108, the charging of capacitor 120 is terminated and the circuit is reset regardless of the state of the TRIGGER inputs or the state of the circuit.

When the ramp start circuitry is activated, it removes the base drive signal on lead 114 which is normally applied to transistor 116 (transistor 116, in the quiescent state, is normally "on" and short circuits timing capacitor 120). However, when the ramp start circuitry is activated, it applies a "low" signal to the base of transistor 116 which turns "off" the transistor. Capacitor 120 then begins charging from VCC, 118, through voltage coupling circuit 122 and resistor 124.

As will be hereinafter described in detail, circuit 106 is designed to accelerate the turn-on of transistor 116 when a reset signal is sensed so that the reset time of the circuit is minimized. Since the reset time is an appreciable part of the overall cycle time, high-speed operation is facilitated.

The voltage across capacitor 120 is compared, by comparator 138, to a minimum delay voltage to generate the minimum delay output. The minimum delay voltage is generated across resistor 117. The voltage appearing across resistor 117 is determined by the voltage coupling circuit 122 which will be described in detail below. In the quiescent state of the circuit, a current source, 127, create an "offset" that maintains the output comparator 138 in an "off" state to avoid an indeterminate state at the output. However, as capacitor 120 charges, the voltage across it quickly exceeds the offset voltage and comparator 138 shifts to a "high" MDO signal indicating a minimum propagation delay through the device. As previously mentioned, the "high" MDO signal can be used as a zero-time reference in a manner similar to the use of analog ground as a zero-voltage reference for a conventional digital-to-analog converter.

The voltage across capacitor 120 increases as the capacitor charges and, eventually, generates a programmed delay output (PDO) signal. The PDO signal on leads 134 is generated by comparator 132 which has inputs 135 which are, in turn, connected to timing capacitor 120 and to a threshold circuit which comprises DAC 128 resistor 119 and current source 127.

As will hereinafter be described in detail, DAC 128 accepts TTL signals representing a digital word on its inputs 130. This digital word is latched into converter 128 by means of a level-sensitive latch signal appearing on lead 131. The DAC effectively appears as a plurality of parallel-connected, binary-weighted current sources 129. In response to the digital word, converter 128 connects these current sources either to supply voltage 118 or resistor 119. The current running through each of the parallel sources is determined by components in the DAC and in voltage coupling circuit 122 so that the total DAC current is independent of the digital word. The portion of the current running through the resistor 119 is determined by the value of the digital word and is also proportional to the total DAC current since it is comprised of the current running through selected ones of the parallel-connected sources. The current running through resistor 119 causes a threshold voltage to develop at point 125, the value of which is dependent on the combination of current sources connected to resistor 119, which combination is, in turn, dependent on the value of the digital word and on the total DAC current.

The total current running through the DAC is determined by internal DAC components, components in voltage coupling circuit 122 and resistor 126. In particular, the DAC current runs through reference resistor 126 to create a reference voltage VA, and, accordingly, the voltage VA is representative of the changes in the DAC current caused by thermal and supply variations. Since the current running through the resistor 119 is proportional to the total DAC current, the threshold voltage appearing across resistor 119 is proportional to the reference voltage VA and variations in the threshold voltage caused by thermal and supply variations are represented by variations in the reference voltage VA.

In accordance with the invention, voltage coupling circuit 122 is arranged to force the voltage, VB, appearing across ramp resistor 124 to be equal to the reference voltage VA. Thus, the charging current to the ramp generating capacitor 120 and the resulting ramp voltage is dependent on the voltage VB, which is equivalent to reference voltage VA. Thus, variations in the internal threshold voltage appearing across resistor 119 appear as corresponding variations in the ramp voltage. Since both the threshold voltage appearing at point 125 and the ramp voltage appearing at point 123 are applied to differential comparator 132, any variations in the voltages due to temperature changes, power supply variations or component variations appears as a common mode signal to differential comparator 132 and are rejected.

Comparator 132 develops an output when the ramp voltage at point 123 reaches the threshold voltage at point 125. At that point, a "high" signal appears on leads 134 which "high" signal indicates the programmed time delay from the occurrence of the MDO signal (or the trigger signal).

As with the circuit that generates the MDO signal, an offset current source 136 is connected to point 125. Current source 136 maintains comparator 132 in its "off" state in the absence of signals from capacitor 120 and converter 128.

Figure 2:
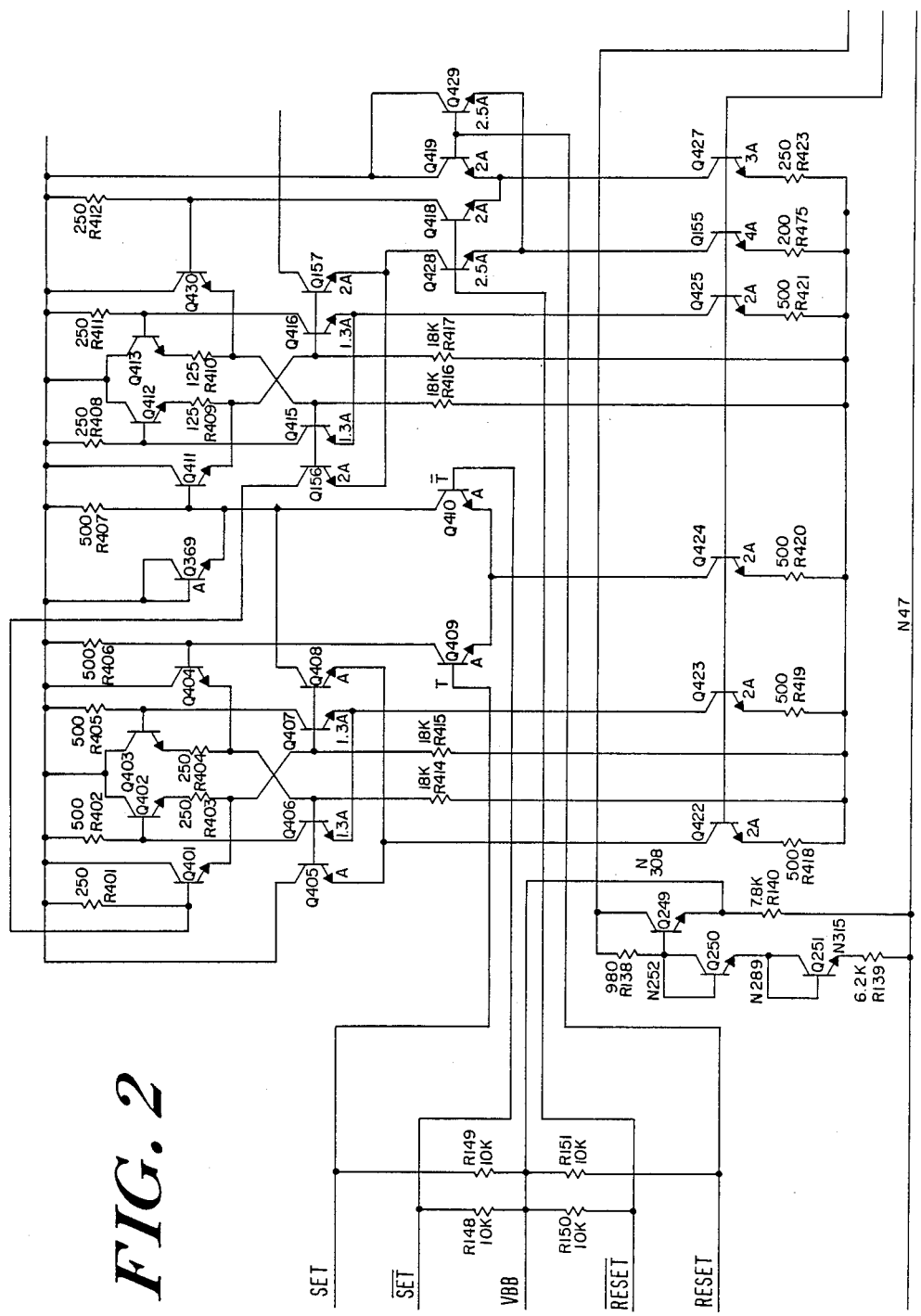
FIG. 2 is a detailed electrical schematic diagram of the trigger/reset flip-flop circuitry.

FIG. 2 shows a detailed electrical schematic of the TRIGGER/RESET flip-flop and input signal comparator circuitry. As previously mentioned, the TRIGGER/RESET flip-flop is designed so that the TRIGGER input is rising-edge sensitive and the RESET input is level sensitive and dominates over the TRIGGER input. The circuitry is arranged so that either single-ended or differential inputs can be used. In the case of a single-ended input, the unused input is pulled by internal resistors to the emitter-coupled logic (ECL) midpoint voltage (VBB). For example, for single-ended operation of the SET input, resistor R148 pulls the SET* input to the midpoint voltage VBB.

Midpoint voltage VBB is established by transistor Q249. More particularly, the base of transistor Q249 is held at a potential between gorund and the negative supply (VEE) by means of a voltage divider consisting of resistor R138, diodes Q250 and Q251 and resistor R139. The emitter of transistor Q249 thus establishes the ECL midpoint voltage by means of current running through resistor R140. It should be noted that some transistors have a notation "A" next to the transistor symbol. This notation refers to the relative emitter area. Thus, a transistor with a notation of 2A has twice the emitter area of a transistor with the notation "A". An absence of a notation denotes a transistor with an area equivalent to a transistor with a notation of "A".

A "high" signal applied to the SET input triggers the device. This "high" signals is applied to the base of transistor Q409. Transistors Q409 and Q410 are connected in a well-known emitter-coupled differential circuit. In this circuit, the emitters of both transistors are tied to a current source which conducts a predetermined amount of current. More specifically, the current source consists of transistor Q424. The base of transistor Q424 is connected to a voltage source whose output is driven by transistor Q203 (shown in FIG. 4). Consequently, the emitter of transistor Q424 is fixed at a predetermined potential and a predetermined, constant current is drawn through resistor R420 to the negative supply voltage, VEE.

Returning to the emitter-coupled differential pair, Q409 and Q410, in accordance with conventional operation, when transistor Q409 turns "on", it conducts the entire current drawn by the current source. Thus, transistor Q410 is turned "off".

With transistor Q410 turned "off", resistor R407 pulls the base of transistor Q411 "high", turning "on" transistor Q411. Turned-on transistor Q411 applies a "high" signal to the base of transistor Q416, in turn, turning it "on". Transistors Q412, Q413, Q415 and Q416 are connected in a flip-flop configuration and, when transistor Q416 turns "on" it pulls the base of transistor Q413 "low", which, in turn, pulls the base of transistor Q415 "low", turning it "off".

When transistor Q415 turns "off", it allows resistor R408 to pull the base of transistor Q412 "high" and turn "on" transistor Q412, which transistor maintains transistor Q416 in an "on" state.

The base of transistor Q157 is also tied to the base of transistor Q416 so that, when the Q412-Q416 flip-flop is set, transistor Q157 is also turned "on". As will hereinafter be described, the collector of transistor Q157 is connected to the ramp generator circuitry so that ramp generation begins when transistor Q157 is turned "on".

At the time when the Q412-Q416 flip-flop is "set", both transistors Q415 and Q156 (connected in parallel to transistor Q415) are turned "off". When transistor Q156 turns "off", it allows resistor R401 to pull the base of transistor Q401 "high". This latter action sets a flip-flop consisting of transistors Q402, Q403, Q406 and Q407. When the Q402-Q407 flip-flop is "set", it turns Q408 "on" which pulls the base of transistor Q411 "low". Transistor Q411 is thus inhibited, to prevent improper re-triggering of TRIGGER input.

As previously mentioned, a RESET signal applied to the RESET input overrides the signals applied to the TRIGGER inputs. Thus, if a "high" RESET signal is applied to the RESET inputs, the converter circuit cannot be triggered and, if the converter circuit had already been triggered, the circuit is reset.

In accordance with one aspect of the invention, the reset circuitry is designed to rapidly turn off transistor Q157, thus resetting the circuit. This rapid turn off is accomplished by immediately depriving transistor Q157 of collector current upon the occurrence of a RESET signal. Subsequently, the triggering flip-flops are reset to maintain the circuit in a reset condition. More particularly, a "high" signal applied to the RESET input is applied to the base of transistor Q429 turning it "on". Transistors Q428 and Q429 are connected in an emitter-coupled differential pair and, thus, transistor Q428 turns "off" when transistor Q429 turns "on". When transistor Q428 turns "off", it deprives transistor Q157 of collector current (since the current for transistors Q156 and Q157 passes through transistor Q428) and transistor Q157 immediately turns "off" resetting the ramp generation circuitry.

In addition, the "high" RESET signal is applied to the base of transistor Q419 turning it "on". Transistors Q418 and Q419 are also connected in an emitter-coupled differential pair and, thus, transistor Q418 turns "off". This latter action allows resistor R412 to pull the base of transistor Q430 "high", resetting the Q412-Q416 flip-flop and maintaining the circuit in the reset condition. When the Q412-Q416 fil-flop is reset Q408 is also turned "on", which action pulls the base of Q411 "low", in turn, inhibiting trigger pulses from retriggering the system.

Figure 3:
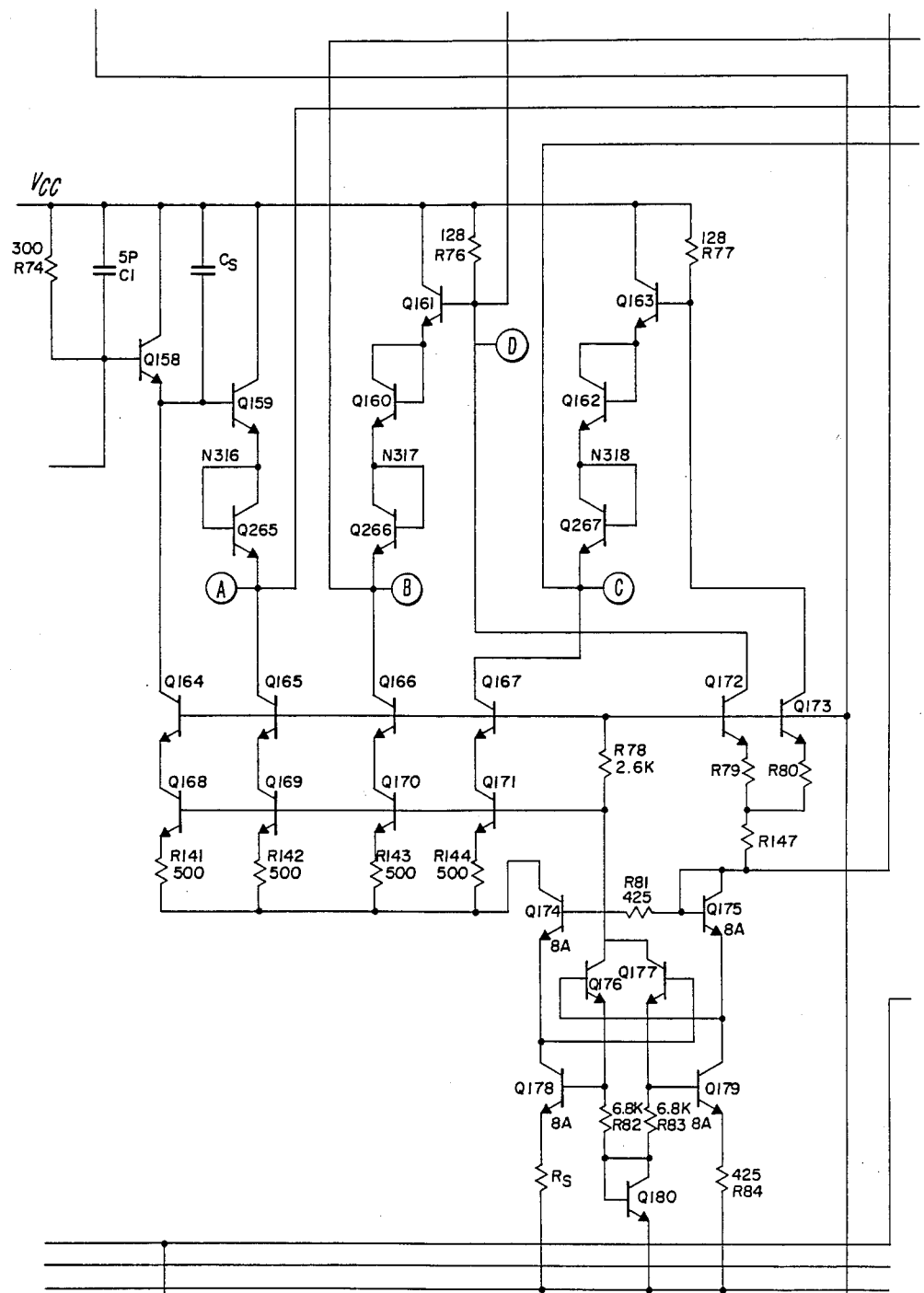
FIG. 3 is a electrical schematic diagram of the ramp generator and current coupling circuitry.

The ramp generator and inventive voltage coupling circuit is shown in detail in FIG. 3. The Ramp generator circuit consists of timing capacitor $C_S$ and timing resistor $R_S$. The voltage coupling circuit consists of transistors Q174–Q180. Ramp generation begins when the TRIGGER/RESET flip-flop is "set" as previously described. More particularly, when transistor Q157 (FIG. 2) turns "on", the base of transistor Q158 is pulled "low" turning the latter transistor "off". Transistor Q158 normally shorts timing capacitor $C_S$. Therefore, when transistor Q158 turns "off", it allows capacitor $C_S$ to begin charging from VCC, through transistors Q164, Q168, resistor R141, Q174, Q178 and timing resistor $R_S$ to the supply voltage VEE.

Transistors Q164 and Q168 act as part of a current divider, however, transistors Q174 and Q178 act, as will hereinafter be described, to insure that the timing capacitor charging current tracks variations in the DAC current caused by thermal and supply variations and, accordingly, that the ramp voltage tracks the threshold voltage.

A capacitor, C1, is connected to the base of transistor Q158 to delay the rise of the base voltage of transistor Q158 during reset of the ramp generator when control transistor Q157 (FIG. 2) turns "off". The small delay produced by capacitor C1 is necessary to prevent transistor Q158 from going into saturation as it charges capacitor $C_S$ during reset operation. Capacitor C1 thus speeds the ramp reset cycle.

The ramp voltage developed across capacitor $C_S$ is applied to the base of transistor Q159 which acts as an emitter follower. From the emitter of transistor Q159 the ramp signal is applied through diode Q265 to point A. The signal at point A is one of the signals which is provided to the output comparator. In order to convert the ramp voltage into a time delay, the ramp voltage is compared to a threshold voltage which is generated by a DAC. As will hereinafter be described, the threshold voltage appears at the base of transistor Q161 and is applied through transistor Q161 (which acts as emitter follower) and diodes Q160 and Q266 to point B. The signal at point B acts is compared to the signal at point A by the output comparator. Since the ramp slope, the initial ramp starting voltage and the threshold voltage are known, a predictable delay can be generated.

More particularly, the threshold voltage is generated by a current drawn through resistor R76 by the DAC. As described in detail below, the DAC converts the value of a digital word into a predetermined current flow through resistance R76 by selectively connecting internal current sources either to resistor R76 or to the power supply. The internal DAC current sources are weighted as binary submultiples of the total DAC current which is independent of the value of the digital word. Accordingly, although the value of the threshold voltage depends on the exact combination of current sources connected to resistor R76, it will always be proportional to the total DAC current. The total DAC current flows from the DAC through the voltage coupling circuit path consisting of transistors Q175 and Q179 and the reference resistor R84 to the supply voltage VEE. Accordingly, the voltage across the reference resistor R84 is proportional to the threshold voltage.

In accordance with another aspect of the invention, the voltage coupling circuit, consisting of transistors Q174–Q179, ensures that the voltage across the ramp generating resistor $R_S$ is equal to the voltage appearing across the reference resistor R84. Thus, the voltage across the ramp generating resistance $R_S$ tracks changes in the voltage across the reference resistor R84.

Figure 4:
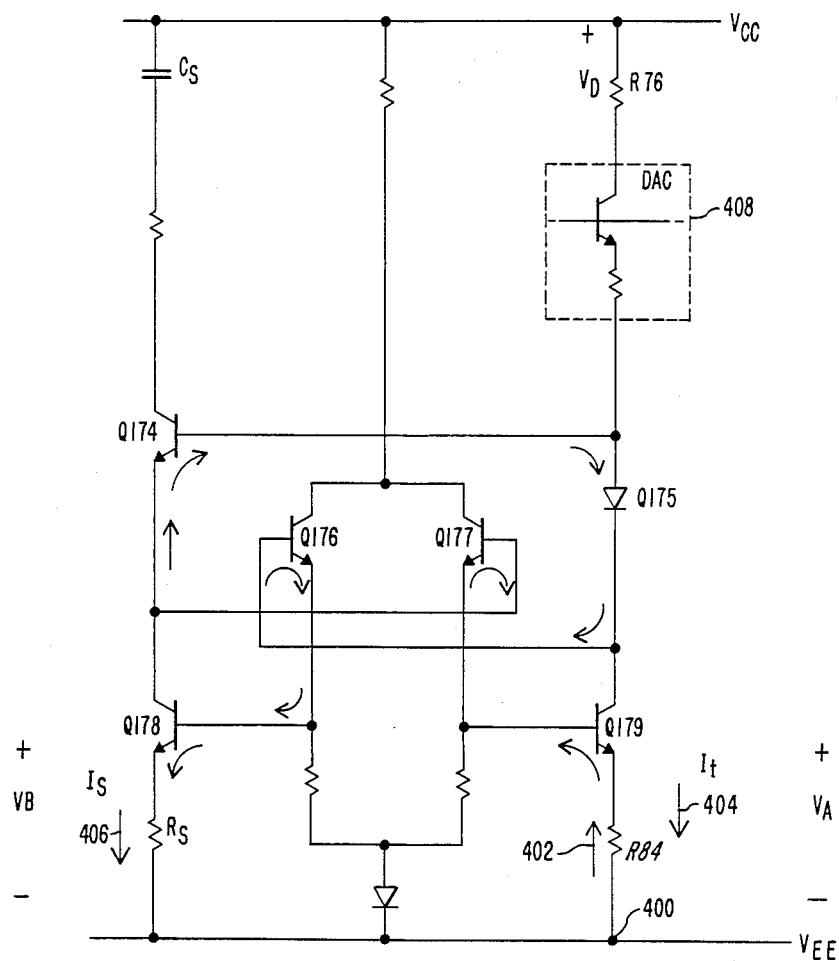
FIG. 4 is a simplified electrical schematic of the current coupling circuit.

The operation of the voltage coupling circuit can be seen by referring to FIG. 4 which is a simplified diagram of the circuit. In FIG. 4, a simple equation can be written for the voltages around the circuit loop staring at point 400 and proceeding around the loop in the direction of arrows 402.

More particularly, starting at point 400, the path extends through resistor R84, the emitter-base voltage of transistor Q179 the emitter-base voltage of transistor Q177, the emitter-base voltage of transistor Q174, the drop across diode Q175, the base-emitter voltage of transistor Q176, the base-emitter voltage of transistor Q178, the drop across resistor $R_s$, to the negative supply voltage VEE and point 400. Assuming that the threshold current is $I_t$ (running in the direction of arrow 404) and the capacitor charging current is $I_s$ (running in the direction of arrow 406), writing the equation for this voltage loop gives the following:

$$-VA + V_{be}(Q179) + V_{be}(Q177) + V_{be}(Q174) - V_{be}(Q175) - V_{be}(Q176) - V_{be}(Q178) + VB = 0 \quad (1)$$

Because transistors Q175 and Q179 are connected in series, with the exception of the base current drawn by transistor Q176, the collector currents of transistors Q175 and Q179 are approximately equal. Since transistor Q176 acts as an emitter follower, if transistor Q176 has a reasonable gain, its base current is small relative to the collector currents of transistors Q175 and Q179 and can be neglected. Thus, to a first-order approximation, the collector currents running through transistors Q175 and Q179 are equal and, consequently, the base-emitter voltages of transistors Q175 and Q179 are approximately equal. Similarly, the base-emitter voltages of transistors Q174 and Q178 are approximately equal and, likewise, the base-emitter voltages of transistors Q176 and Q177. With these equalities, equation (1) above reduces to the following:

$$-VB + VA = 0 \quad (2)$$

and consequently, $$VA = VB \quad (3)$$

In addition, to a first order approximation, the current $I_t$ running in the direction of arrow 404 through the reference resistance R84 also runs either through resistance R76 or directly from the power supply through the DAC. Assuming that a fraction, K, of the DAC current is directed through resistor R76 as determined by the action of the DAC and by the value of the digital word, the threshold voltage at point B (VD) will be proportional to the reference voltage VA.

$$VA = I_t * R84 \quad (4)$$

and $$VD = K * I_t * R76 \quad (5)$$

thus, eliminating $I_t$, $$VD = K * VA * R76/R84 \quad (6)$$

Thus, it can be seen that the threshold voltage is, to a first order approximation, proportional to the reference voltage. Since the constant of proportionality depends upon the ratio of two resistor values, if both resistors are diffused and have approximately the same temperature coefficient (TC), the TCs of the resistors cancel out and do not affect the ratio of the voltages VD and VA.

The capacitor charging current is proportional to the voltage VB divided by the value of resistor $R_s$. Since the voltage VB is forced to be equal to the value of the reference voltage VA, the ramp capacitor charging current, and consequently, the ramp voltage, is impressed with the same temperature and power supply variations as the threshold voltage.

Both the ramp voltage signal and the threshold voltage are effectively applied to a differential comparator to generate the programmed delay output. The temperature, supply and base-emitter-voltage induced variations in these voltages are seen as common-mode signals by the output comparator and rejected. Thus, the temperature and supply variations of the programmed delay is, to a first-order approximation, a function only of the TCs of the external timing components $R_s$ and $C_s$. In the same manner, power supply variations (in VEE) also appear as a common mode signal to the output comparator and are also rejected.

The equalities in equations (2), (3) (5) and (6) are only first order approximations due to the effect of base currents. In particular, transistors Q178 and Q179 draw a finite base current from the opposite leg of the coupling circuit. In the illustrative circuit, the effect of these base currents has been reduced by the use of emitter followers Q176 and Q177 which reduce the base current draws to a low value.

The proportionality of the voltage VD to the reference voltage VA is further compensated by the addition of a resistance in the base connection of transistor Q174. If this resistance is not inserted and the base of transistor Q174 is connected directly to the collector of transistor Q175 (as shown in FIG. 4), then the current flowing out of the DAC is not completely equivalent to $I_t$ because transistor Q174 draws additional base current away. Accordingly, the DAC current will be larger than it should because some current has been added to it. In order to compensate for this effect, a resistance (shown as resistor R81 in FIG. 3 is inserted into the base path of transistor Q174. Since the base of transistor Q174 is fixed relative to the reference voltage VA (by means of $V_{be}$ diode drops of transistors Q179, Q177 and Q174), this resistance has the effect of reducing the voltage at the emitter of Q179 by an amount equal to the base current times the value of the resistor. If the compensating resistor has the same value as reference resistor R84, then the voltage decrease will exactly cancel the effect of the base current.

Another variation that is compensated by the output comparator is the change in the base-emitter voltage of transistor Q158 due to variations in the collector current of transistor Q158. These variations may, for example, be caused by variations in $R_s$ which is provided by the user. To compensate for these variations, (referring to FIG. 3) the ramp voltage and the threshold voltage are connected to the output comparator via equivalent paths. These paths consist of Q158, Q159 and Q265 for the ramp signal and Q161, Q160 and Q266 for the threshold signal. Transistors Q165 and Q166 act as current sources, and draw equal currents both of which are proportional to the value of resistor $R_s$. Accordingly, variations in $R_s$ appear in both the ramp signal and the threshold signal as common-mode signals and are rejected by the output comparator.

In order to generate a minimum delay out (MDO) signal which does not depend on the value of the digital word, a separate MDO threshold is set by resistor R77 at the base of transistor Q163. This threshold voltage is provided through diodes Q162 and Q267 to point C which is an input to the minimum delay out comparator. The MDO comparator compares the value of the MDO threshold voltage to the value of the ramp signal to generate the MDO signal.

Transistors Q172 and Q173 act as offset current sources. They are used to ensure that the programmed delay output and the MDO comparators remain in a predetermined state in the quiescent state. Transistors Q172 and Q173 draw a sufficient amount of current through resistors R76 and R77, respectively, to place both the MDO comparator and the programmed delay out comparator into "low" output states in the quiescent circuit condition.

Figure 5:
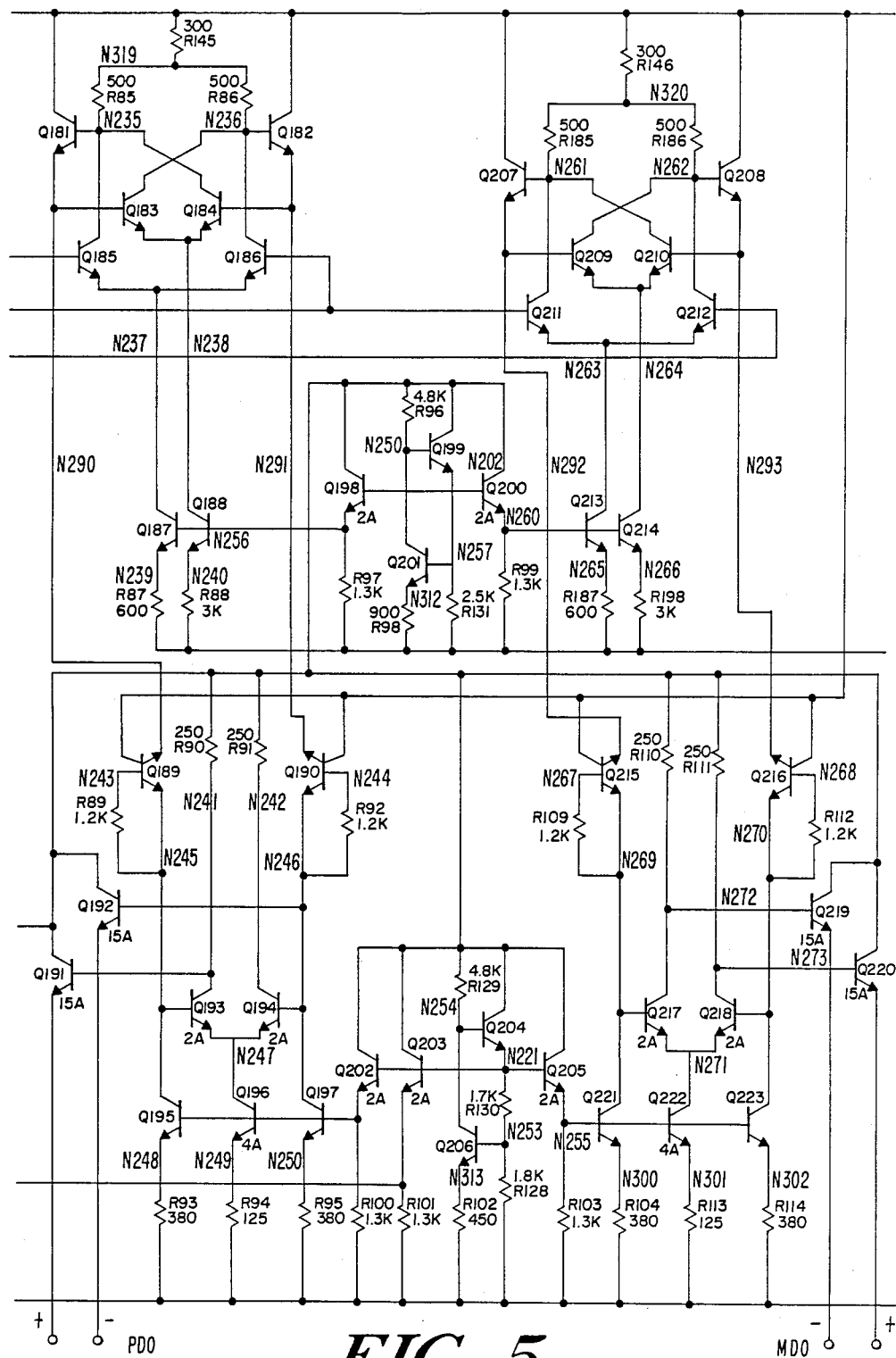
FIG. 5 is an electrical schematic diagram of the output comparators.

The output comparator circuitry for both the programmed delay out signal and the MDO signal are shown in FIG. 5. Both the comparator for the MDO signal and the programmed delay output are identical and, thus, only one circuit will be described in detail.

The programmed delay output (PDO) comparator consists of a first-stage differential input circuit (consisting of transistors Q181-Q186), level shifters Q189 and Q190, a second-stage differential amplifier (transistors Q193 and Q194) and output drivers Q191 and Q192. More particularly, the base of transistor Q186 receives the ramp signal generated from point A in FIG. 3. The base of transistor Q185 receives the threshold signal generated at point B of FIG. 3. Transistors Q185 and Q186 (FIG. 5) form a differential pair which, in turn, drive transistors Q181 and Q182. A small amount of hysteresis is employed in the input stage in order to minimize output comparator propagation delay in various overdrive conditions. The hysteresis is created by drawing small currents through the emitters of transistors Q183 and Q184 by means of transistor Q188. The currents have values such that the second-stage gain times the first-stage hysteresis equals a valid output logic swing.

Figure 11:
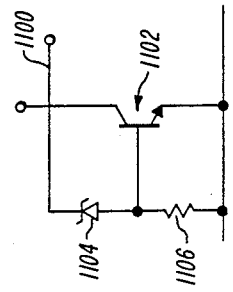
FIG. 11 is an equivalent circuit diagram for a level shifting device used in the circuit.

The output signals on the emitters of transistors Q181 and Q182 are level-shifted by means of devices Q189 and Q190 and their accompanying resistors, R89 and R92. An equivalent circuit for these devices is shown in FIG. 11. The input drives the output transistor 1102 through a Zener diode 1104 which provides the level shift. A resistor 1106 is used to provide bias current for the Zener device.

The level-shifted signals are provided to the base of a differential amplifier consisting of transistors Q193 and Q194 which is used to amplify the output signals. Finally, the output signals are applied to the bases of output drivers Q191 and Q192, respectively, which act as emitter followers to provide output current drive to the output signal leads.

Transistors Q202-Q206 operate as a voltage bias source which provides a predetermined voltage to drive the current sources used in the differential devices. Similarly, transistors Q198-Q201 also provide a voltage reference source for driving the current sources which operate various differential devices.

Figure 6:
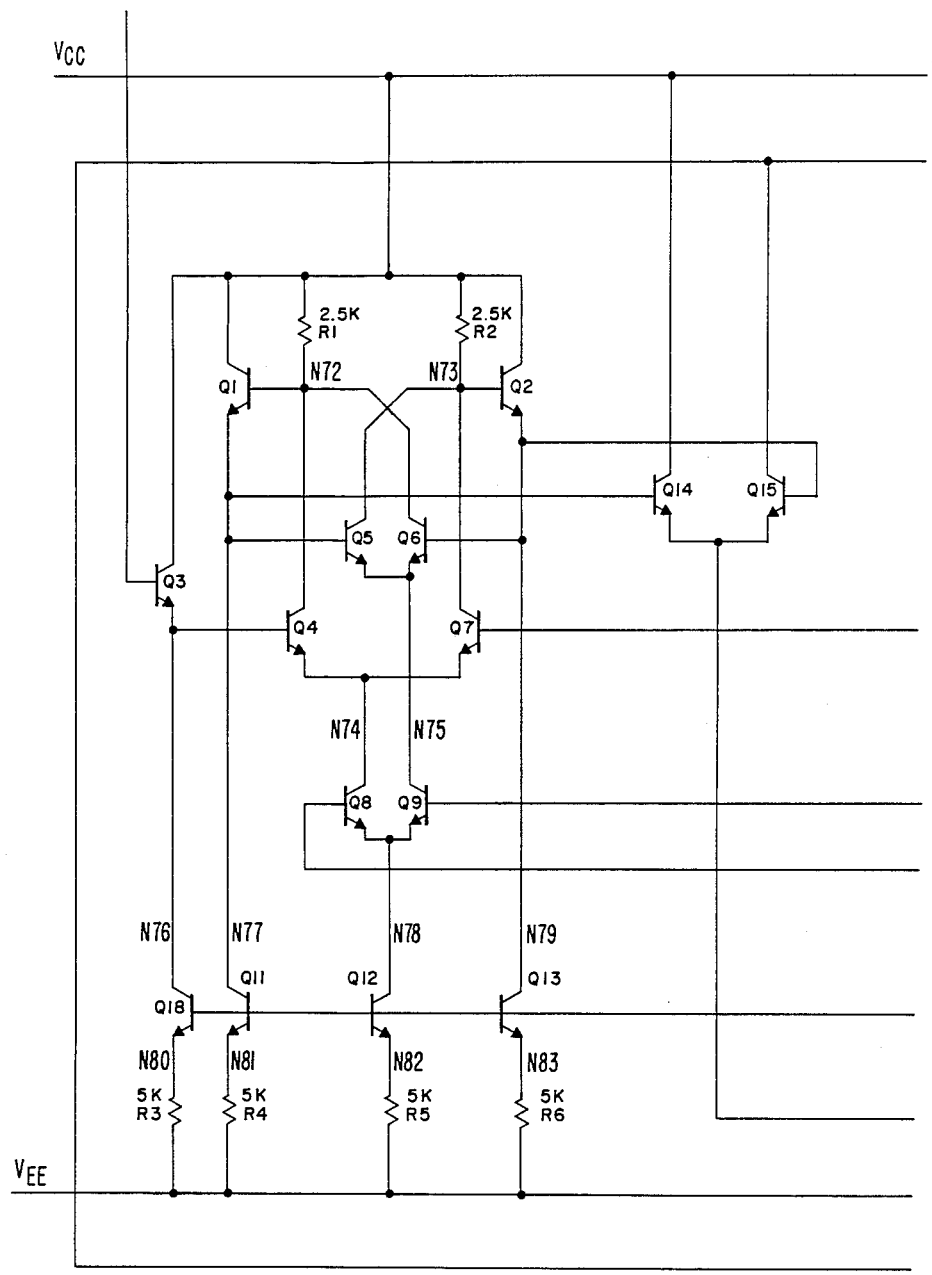
FIG. 6 is a detailed electrical schematic of the input section of the digital-to-analog converter.
Figure 7:
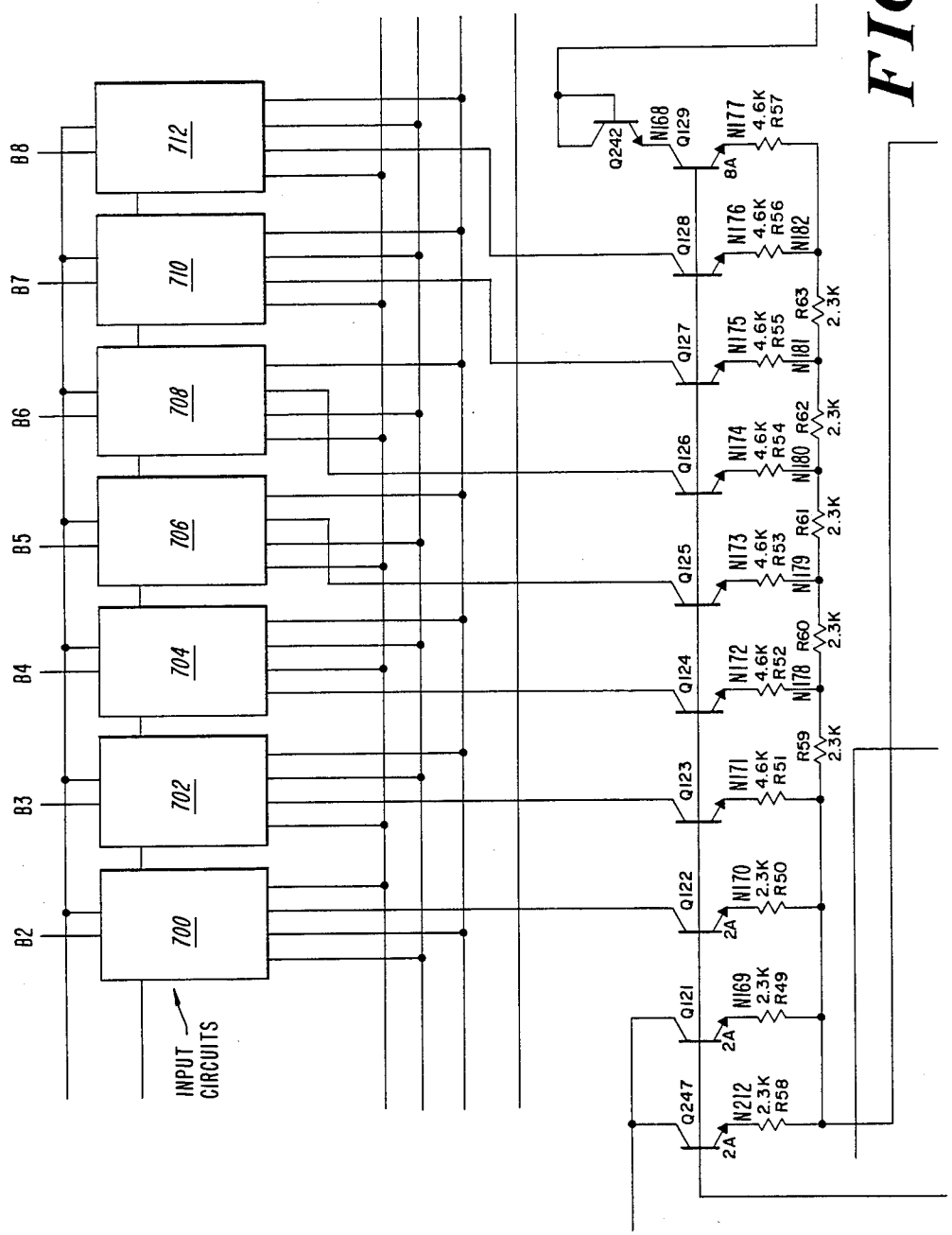
FIG. 7 is an electrical schematic of the conversion section of the digital-to-analog converter.
Figure 8:
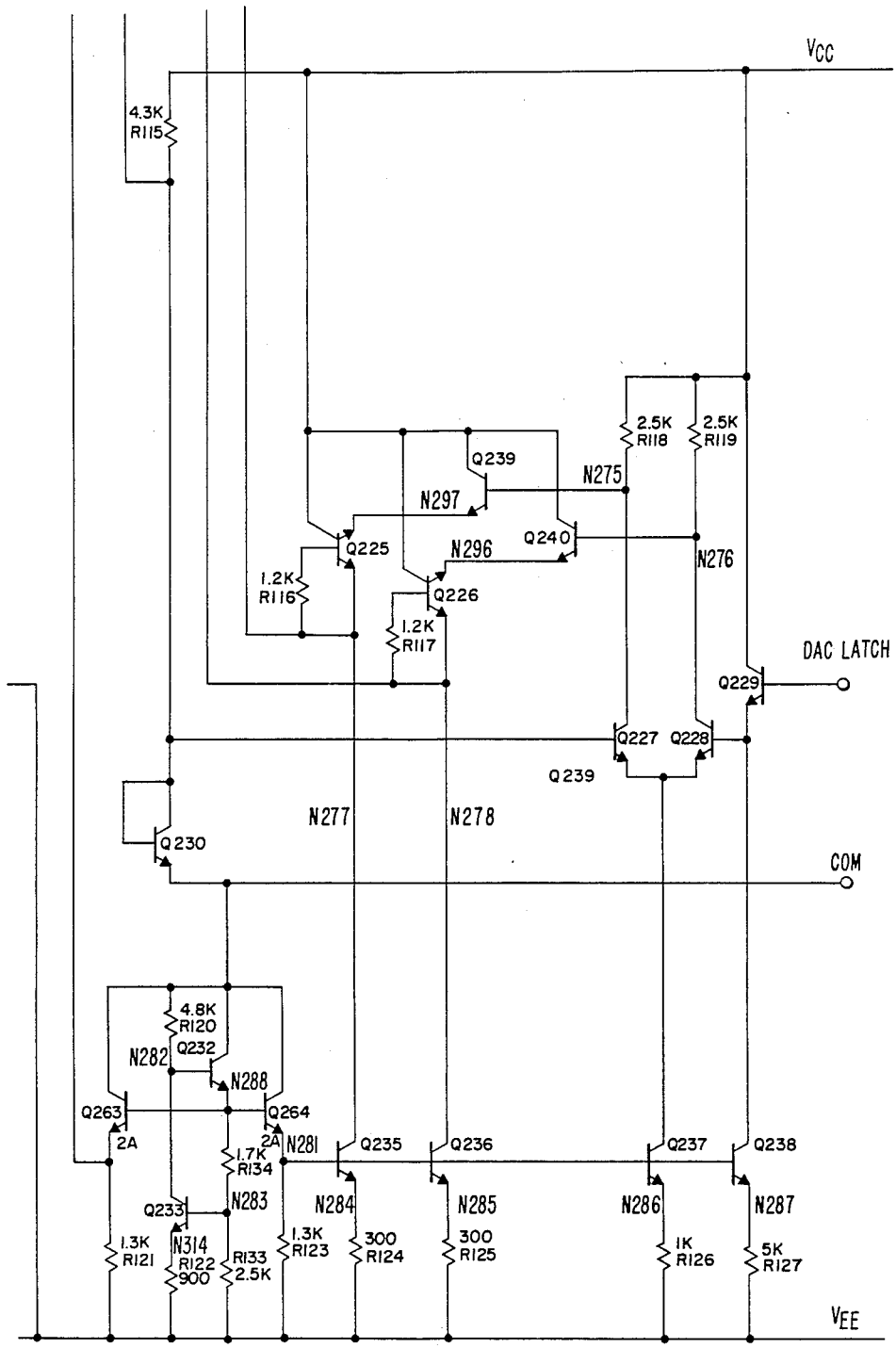
FIG. 8 is a detailed electrical schematic of the input latch section of the digital-to-analog converter.
Figure 10:
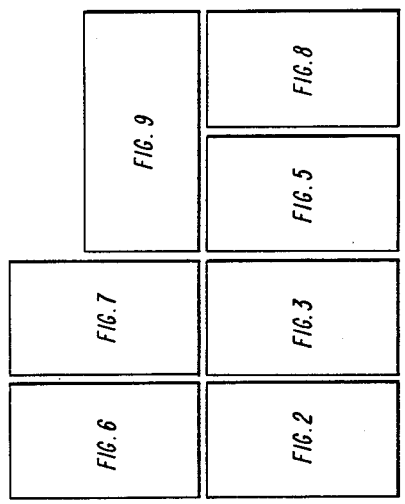
FIG. 10 shows the arrangement of FIGS. 2,3 and 5-9 to form the complete circuit.
Figure 9:
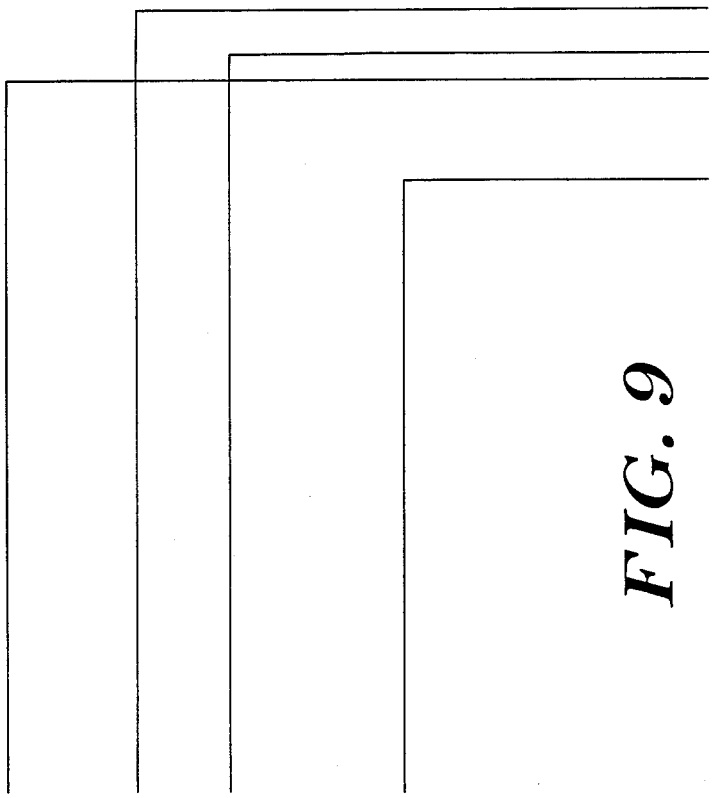
FIG. 9 is a section of the wiring for the digital-to-analog converter.

The DAC used in the inventive circuitry is shown in FIGS. 6-9. The DAC essentially consists of a plurality of eight input circuits (of which one is shown in FIG. 6 and the remaining seven, 700-712, are shown in FIG. 7) a plurality of parallel-connected current sources shown in FIG. 7 and a DAC input latch circuit shown in FIG. 8. FIG. 9 shows additional wiring for connecting FIG. 7 to FIG. 8.

The DAC input circuits are identical and, accordingly, only one is discussed in detail for clarity. The input circuits accept eight standard TTL logic signals on leads designation B1-B8. One bit of the digital input word is applied to each input circuit. For the circuit shown in FIG. 6, the digital signal appears on input lead B1 and is, in turn, applied to the base of transistor Q3. Transistor Q3 acts as an emitter-follower and drives transistor Q4, the emitter of which is connected to the emitter of transistor Q7.

Assuming, for the moment, that transistor Q8 is "on", transistors Q4 and Q7 act as a differential pair. A "high" digital input signal causes transistor Q4 to turn "on". As transistor Q4 turns "on", transistor Q7 turns "off". Transistors Q4 and Q7 control transistors Q1 and Q2 which, in turn, control a current switch consisting of transistors Q14 and Q15. Transistors Q14 and Q15 either connect point D in the threshold circuit (FIG. 3) to the DAC circuit (in the case of a "high" digital input bit) or disconnect point D in the threshold circuit to the DAC circuit (in the case of a "low" digital input bit).

More specifically, transistor Q4, in turning "on", pulls the base of transistor Q1 "low", causing transistor Q1 (which acts as an emitter-follower) to apply a "low" signal to the base of transistor Q14. Transistor Q7, in its "off" state, allows resistor R2 to pull the base of transistor Q2 "high" which action, in turn, applies a "high" signal to the base of transistor Q15. Transistor Q15 thus turns "on" and transistor Q14 turns "off". When transistor Q15 turns "on", it connects the base of transistor Q161 to one of the DAC current sources shown in FIG. 7. Alternatively, when transistor Q14 is "on", it connects VCC to the DAC current source shown in FIG. 7. Consequently, resistor R76 in the threshold circuit is selectively connected to one or more current sources in the DAC circuit by the input circuits depending on the number of "high" bits in the digital word.

Transistors Q8 and Q9 act as a current-steering switch which is used to "latch" the input signal as will hereinafter be described. During digital signal input, transistor Q8 is turned "on", in turn, enabling transistors Q4 and Q7. However, when a DAC latch signal is applied to the circuit (as described below), transistor Q9 turns "on" and transistor Q8 turns "off". When transistor Q8 turns "off", transistors Q4 and Q7 are disabled. However, transistors Q5 and Q6 are turned "on".

Transistors Q5 and Q6 form a flip-flop circuit with transistors Q1 and Q2 which maintains the on-off state of transistors Q1 and Q2 which existed at the time the digital inputs were latched. Thus, if transistor Q1 is "on" at the time when transistor Q9 turns "on", transistor Q5 will also turn "on" which, in turn, holds transistor Q2 in the "off" state. Alternatively, if transistor Q1 is "off" when transistor Q9 turns "on", then transistor Q5 will also be "off", allowing resistor R2 to pull the base of transistor Q2 "high", turning it "on". Transistor Q2, in turning "on", turns "on" transistor Q6, thereby pulling the base of transistor Q1 "low" to holding it in its "off" state. Thus, the inputs digital signals are latched into the input circuits upon the application of a DAC latch signal.

The DAC current sources are shown in FIG. 7 and consist of nine transistors with bases connected in parallel to the signal common terminal. Transistors Q123-Q128 and their associated resistances form a conventional R-2R resistance ladder. Together with transistors Q247-Q122, the effect is to form a plurality of parallel-connected current sources. The currents drawn by the sources are related by binary weights toward each other. For example, the current drawn by transistor Q123 is twice the current drawn by transistor Q124 and so on. The general configuration of this circuit and its operation is well-known.

With the exception of transistors Q247 and Q121, each of the nine transistors drives a switch at its collector, which switch is controlled by one of the latch circuits. Transistors Q247 and Q121 are connected in parallel to reduce the value of their effective emitter resistances to an appropriate value. As previously described, the input circuits are controlled by the digital input word and connect the collectors of the transistors either directly to VCC or to VCC through resistance R76. Accordingly, the total DAC current is independent of the value of the digital word. However, the current running through resistor R76 depends on the settings of the DAC input switches and, thus, the threshold voltage developed across the resistor R76 depends on the value of the digital word.

In a conventional binary-weighted current DAC such as that shown in FIG. 7, it is necessary to maintain strict proportionality between the currents drawn by the current sources. However, each of these currents is produced by a voltage drop across a resistive network and the voltage drop incorporates the base-emitter voltage of the transistor associated with that current source. Since the currents passing through each of the transistors is different, the base-emitter voltages will also be different. These latter differences upset the strict proportionality of the currents drawn by each of the sources. Several prior art arrangements have been used to compensate for this imbalance. Such arrangements include unequal emitter areas of the current source transistors. By appropriately sizing the emitter areas, the base-emitter voltages can be adjusted to compensate for the difference in current magnitudes. Unfortunately, the application of this technique to DACs with more than a few bits requires some of the transistors to have impractically large areas, thus requiring well-known techniques of partitioning. Such techniques are described in U.S. Pat. Nos. 3,978,473 and 4,020,486 assigned to the assignee of the present invention and incorporated herein by reference. Another prior art alternative is to use inter-base resistances which adjust the base currents to compensate for the differences in collector currents of the transistors. Such an arrangement is shown in U.S. Pat. No. 3,940,760 and assigned to the assignee of the present invention and incorporated herein by reference.

Alternatively, it is possible to use a compensation circuit which introduces a compensating voltage at the end of the R-2R resistor network. Such an arrangement modifies the currents in each of the current sources in such a manner that the currents, although modified, remain in binary ratios. The operation of such a compensating circuit is more fully described in U.S. Pat. No. 4,349,811 issued to Paul Brokaw on Sept. 14, 1982 and assigned to the assignee of the present invention. The disclosure of this latter patent is hereby incorporated by reference. As described in this patent, a special compensation circuit is connected to the end of the R-2R chain to provide the proper compensating voltage.

However, in accordance with another aspect of the invention, the special compensation circuit is simplified by passing through the DAC circuit a current which is roughly proportional to absolute temperature (PTAT). In most conventional DAC circuits, the total DAC current is carefully fixed to a precise value. However, in the inventive circuit the total DAC current can be allowed to vary as a function of temperature due to the action of the voltage coupling circuit. Because the voltage coupling circuit causes the ramp voltage to track the threshold voltage regardless of the actual voltage values, the precise value of the DAC current can be allowed to vary and the circuit will still provide temperature compensation as described above.

In accordance with another aspect of the invention, it has been discovered that if the DAC current is PTAT, then the proper compensation as set forth in U.S. Pat. No. 4,349,811 can be provided by placing a single transistor at the end of the current source ladder whose emitter voltage is smaller than the emitter voltage in the current source transistor of the least significant bit by a difference of 2kT/q (ln 2). Because the DAC bias current is PTAT, the current in R57 can be maintained at twice the current in R56 over temperature. By well-known formulas this condition can be obtained by providing a compensation transistor having an emitter area of eight times the area of the least-significant bit transistor. Thus transistor Q129, which has an emitter area of eight times transistor Q128, can supply the correct compensating current. A diode provided by transistor Q242 is placed in the collector circuit of transistor Q129 to compensate for the diode introduced by the current steering circuits in the input circuits (the base-emitter of transistors Q14 or Q15 in FIG. 6).

The total current running through the DAC circuit is roughly PTAT because of the way it is generated. In particular, the DAC current results from placing the supply voltage (VEE) of 5.2 volts across four diode voltage drops and various resistors. The four diode voltage drops can be seen by following the circuit starting at signal ground, the base emitter diode of transistor Q247 (FIG. 7), the base-emitter diode of transistors Q174 and Q177 and Q179 (FIG. 3) through resistor R84 to supply voltage VEE. Similarly, four diode drops appear in each of the current source circuits.

If the four diodes and the resistors had 4.88 volts across them, then the resulting current would be substantially PTAT. Since, in the actual circuit, 5.2 volts are placed across the four diode voltage drops and resistors, the DAC current is only roughly PTAT. However, it is sufficiently close that the proper compensation can be obtained by the simple transistor compensation circuit consisting of transistor Q129.

FIG. 8 shows the latching circuitry which is used to latch the digital word bits into the DAC input circuits. In particular, the DAC latch signal is applied to the base of transistor Q229. When a "high" DAC latch signal is applied, transistor Q229 turns "on" and turns "on" transistor Q228 and turns "off" transistor Q227. When transistor Q228 turns "on", it applies a "low" signal, via emitter-follower 240, to level shifter circuit Q226.

Transistor Q226, in turning "on", applies a "low" signal to transistor Q9 in the input circuits (one of which is shown in FIG. 7). As previously mentioned, this "high" signal causes the input circuits to latch the input digital word bits.

Transistors Q232-Q238 are used to provide a voltage reference source which powers the current sources that drive the differential circuits.

In the illustrative embodiment shown in FIGS. 2–9, resistor values are noted next to each resistor. The values are given in ohms with the notation "K" equivalent to a multiplier of 1000. Capacitor values are given in picofarads. The transistors are of standard NPN configuration.

What is claimed is:

1. A circuit for converting the value of a digital word into a proportional time delay in response to a trigger signal, said circuit comprising,
a digital-to-analog converter having a first current path and a second current path connected in parallel to a current output, means for drawing a DAC current from said current output, and means responsive to said digital word for changing the magnitude of a first current flowing through said first current path,
means for generating a threshold voltage proportional to said first current,
means responsive to said DAC current for generating a reference voltage,
means responsive to said reference voltage for producing a proportional ramp current, and
means responsive to said trigger signal for generating an increasing ramp voltage whose rate of increase is proportional to said ramp current,
a differential comparator means responsive to said ramp voltage and said threshold voltage for generating an output representative of said time delay.

2. A circuit for converting the value of a digital word into a proportional time delay according to claim 1 wherein said DAC current is substantially independent of the value of said digital word.

3. A circuit for converting the value of a digital word into a proportional time delay according to claim 1 wherein said ramp voltage generating means comprises a capacitor connected electrically in series with said ramp resistor.

4. A circuit for converting the value of a digital word into a proportional time delay according to claim 1 wherein said producing means comprises a ramp resistor and means responsive to said reference voltage for placing a voltage proportional to said reference voltage across said resistor to generate said ramp current.

5. A circuit for converting the value of a digital word into a proportional time delay according to claim 4 wherein said producing means further comprises a first transistor and a second transistor connected electrically in series with said capacitor and said ramp resistor.

6. A circuit for converting the value of a digital word into a proportional time delay according to claim 5 wherein said producing means further comprises a third transistor and a fourth transistor connected electrically in series with said digital-to-analog converter output and said reference resistor.

7. A circuit for converting the value of a digital word into a proportional time delay according to claim 6 wherein said first transistor has an emitter and said second transistor has a collector and said first transistor emitter is connected in series with said collector of said second transistor.

8. A circuit for converting the value of a digital word into a proportional time delay according to claim 7 wherein said third transistor has an emitter and said fourth transistor has a collector and said third transistor emitter is connected in series with said collector of said fourth transistor.

9. A circuit for converting the value of a digital word into a proportional time delay according to claim 8 wherein said second transistor has a base electrode responsive to the voltage at the collector of said fourth transistor.

10. A circuit for converting the value of a digital word into a proportional time delay according to claim 9 wherein said fourth transistor has a base electrode responsive to the voltage at the collector of said second transistor.

11. A circuit for converting the value of a digital word into a proportional time delay according to claim 9 wherein said base terminal of said fourth transistor is connected to said collector terminal of said transistor by means of an emitter follower circuit.

12. A circuit for converting the value of a digital word into a proportional time delay in response to a trigger signal, said circuit comprising,
a digital-to-analog converter having a first current input and a second current input and a current output and a plurality of parallel-connected, binary-weighted current sources connected between said current inputs and said current output, and wherein said analog-to-digital converter is responsive to said digital word for selectively connecting said current sources between said current inputs and said current output so that a first current whose value is proportional to the value of said digital word passes between said first current input and said current output and so that the overall DAC current flowing between said current inputs and said current output is independent of the value of said digital word,
means for generating a threshold voltage by passing said first current through a threshold resistor,
means responsive to said trigger signal for generating an increasing ramp voltage in response to a ramp current,
means for generating a reference voltage by passing said DAC current through a reference resistor,
a voltage coupling circuit responsive to said reference voltage for producing a ramp current the magnitude of which is proportional to said reference voltage,
a differential comparator means responsive to said ramp voltage and said threshold voltage for generating an output representative of said time delay.

13. A circuit for converting the value of a digital word into a proportional time delay according to claim 12 wherein said ramp voltage generating means comprises a capacitor and a ramp resistor connected electrically in series with said capacitor for charging said capacitor.

14. A circuit for converting the value of a digital word into a proportional time delay according to claim 13 wherein said voltage coupling circuit comprises means responsive to said reference voltage for placing a voltage with a magnitude equal to said reference voltage across said ramp resistor.

15. A circuit for converting the value of a digital word into a proportional time delay according to claim 14 wherein said voltage coupling circuit further comprises a first transistor, a second transistor, a third transistor and a fourth transistor, all of said transistors haing base, collector and emitter terminals, said first and second transistors being connected in series between said ramp resistor and said capacitor and said third and fourth transistors being connected in series between said digital-to-analog converter output and said reference resistor.

16. A circuit for converting the value of a digital word into a proportional time delay according to claim 15 wherein the base terminals of said first transistor and said third transistor are connected together.

17. A circuit for converting the value of a digital word into a proportional time delay according to claim 16 wherein the base terminal of said second transistor is connected to the collector terminal of said fourth transistor and the base terminal of said fourth transistor is connected to the collector terminal of said second transistor.

18. A circuit for converting the value of a digital word into a proportional time delay according to claim 17 wherein said base terminal of said second transistor is connected to the collector terminal of said fourth transistor by means of an emitter follower circuit.

19. A digital-to-time converter circuit for converting the value of a digital word into a proportional time delay in response to a trigger signal, said circuit comprising, a threshold resistor, a digital-to-analog converter having a first current input connected to said threshold resistor, a second current input connected to power, a current output and a plurality of internal parallel-connected, binary weighted current sources connectable between said current inputs and said current output, and wherein said analog-to-digital converter is responsive to said digital word for selectively connecting said current sources between said current inputs and said current output so that a first current whose value is proportional to the value of said digital word passes through said threshold resistor and so that the overall DAC current flowing between said current inputs and said current output is independent of the value of said digital word, a capacitor, a ramp resistor connected in series with said capacitor for charging said capacitor by means of a ramp current running through said resistor to generate a ramp voltage, a flip-flop responsive to said trigger signal for generating a ramp control signal, a control switch normally short circuiting said capacitor, said control switch being responsive to said ramp control signal for allowing said capacitor to charge through said ramp resistor, a reference resistor connected in series with said digital-to-analog converter for generating a reference voltage in response to said DAC current, a first transistor having a collector connected in series between said capacitor and said ramp resistor, a second transistor having a collector connected in series between said digital-to-analog converter and said reference resistor, said first transistor having a base electrode connected to the collector of said second transistor by means of an emitter follower circuit and said second transistor having a base electrode connected to the collector of said first transistor by means of an emitter follower circuit so that the voltage across said reference resistor equals the voltage across said ramp resistor, and a differential comparator circuit responsive to said ramp voltage and said threshold voltage for generating an output representative of said time delay.

20. A digital-to-time converter circuit according to claim 19 wherein said differential comparator circuit has an input connected to said capacitor and an input connected to said threshold resistor.

21. A digital-to-time converter circuit according to claim 20 wherein the inputs of said differential comparator are connected to said capacitor and to said threshold resistor by means of emitter follower circuits and wherein the current flowing through each of said emitter follower circuits is proportional to said ramp current.

* * * * *